US 6,560,737 B1

(12) United States Patent
Colon-Bonet et al.

(10) Patent No.: US 6,560,737 B1
(45) Date of Patent: May 6, 2003

(54) METHOD FOR ADDING SCAN CONTROLLABILITY AND OBSERVABILITY TO DOMINO CMOS WITH LOW AREA AND DELAY OVERHEAD

(75) Inventors: Glenn T Colon-Bonet, Ft Collins, CO (US); Samuel D Naffziger, Ft Collins, CO (US); Barry J Arnold, Ft Collins, CO (US); Thomas Justin Sullivan, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/505,383

(22) Filed: Feb. 16, 2000

(51) Int. Cl.[7] .............................................. G01R 31/28
(52) U.S. Cl. ....................................................... 714/726
(58) Field of Search ................................ 714/726, 727; 326/16

(56) References Cited

U.S. PATENT DOCUMENTS

| 5,517,136 A | 5/1996 | Harris et al. ................... 326/93 |
|---|---|---|
| 5,619,511 A | 4/1997 | Sugisaw a et al. ......... 371/22.3 |
| 5,740,181 A | 4/1998 | Heikes et al. ............... 371/22.3 |
| 5,764,083 A | 6/1998 | Nguyen et al. ................ 326/93 |
| 5,796,282 A | 8/1998 | Sprague et al. .............. 327/210 |
| 5,825,208 A | 10/1998 | Levy et al. ..................... 326/98 |
| 5,859,999 A | 1/1999 | Morris et al. ................ 712/234 |
| 5,860,017 A | 1/1999 | Sharangpani et al. ......... 712/23 |
| 5,938,782 A * | 8/1999 | Kay ............................. 714/726 |
| 6,198,324 B1 * | 3/2001 | Schober ....................... 327/202 |

OTHER PUBLICATIONS

Wolfe, A., "Patents shed light on Merced's Innards", Electronic Engineering Times, Feb. 15, 1999.

* cited by examiner

*Primary Examiner*—Albert Decady
*Assistant Examiner*—Shelly A Chase (57) ABSTRACT

Circuitry for scanning and observing domino CMOS logic or other logic gates. Master and slave stages includes circuitry for latching a bit into the master stage through pulsing of a clock signal and subsequently latching the bit into the slave stage through pulsing of another clock signal. The number of transistors required for scanning is minimized by using existing latch structures within the logic.

16 Claims, 9 Drawing Sheets

METHOD FOR ADDING SCAN CONTROLLABILITY AND OBSERVABILITY TO DOMINO CMOS WITH LOW AREA AND DELAY OVERHEAD

FIELD OF THE INVENTION

The present invention relates to a method and circuitry for adding scan controllability and observability to Domino CMOS logic or other logic gates.

BACKGROUND OF THE INVENTION

Scan control circuitry is used for testing of logic gates. Using the scan control circuitry, logic bits are scanned into the circuitry using one or more normal clock steps, and the results are observed. Typical scanning circuitry often requires a large overhead in terms of the number of transistors that must be added to test particular logic circuitry, such as Domino CMOS logic gates. The scan circuitry can also generate inherent races that can be difficult to control. In addition, the circuitry often must be specially modified for different types of logic cells. Accordingly, a need exists for improved scan circuitry for testing and observing operation of Domino CMOS logic or other types of logic gates.

SUMMARY OF THE INVENTION

A circuit consistent with the present invention is used for scanning a logic gate in order to observe operation of the logic gate. It includes a master scan stage for scanning a bit into a first logic cell, and the master scan stage uses a latch structure in the first logic cell for scanning the bit. The circuit also includes a slave scan stage for scanning the bit from the first logic cell into a second logic cell.

A method consistent with the present invention includes master and slave scanning steps. The master scanning step includes scanning a bit into a master scan stage having a first logic cell. It further includes using a latch structure in the first logic cell for scanning the bit and receiving clock signals for controlling the scanning. The slave scanning step includes scanning the bit from the first logic cell into a slave scan stage having a second logic cell.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
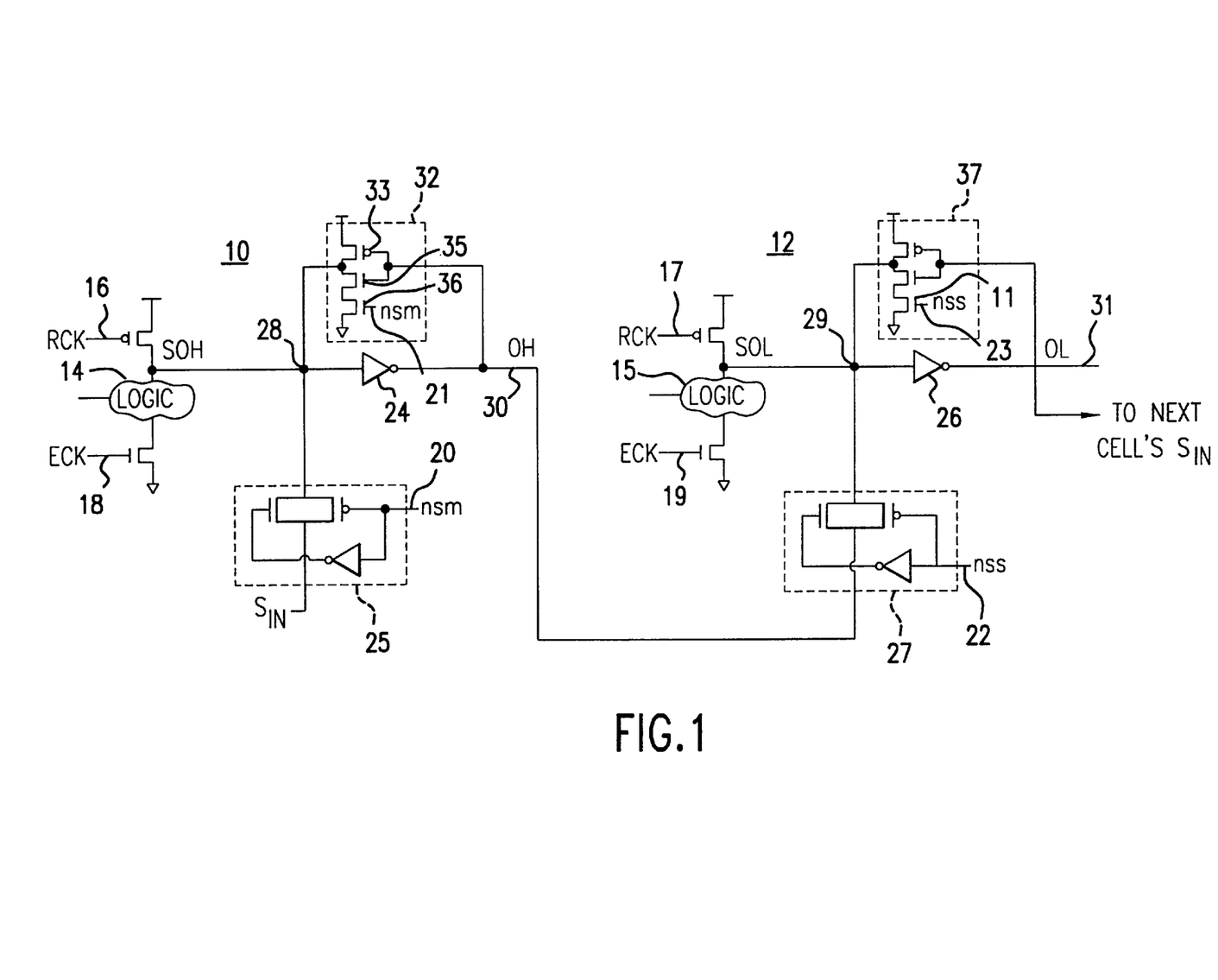
FIG. 1 is a circuit diagram of master and slave scan stages for scan controllability and observability of dual rail Domino CMOS logic.

FIG. 1 is a diagram of circuitry for scanning and observing operation of dual rail Domino CMOS logic. It includes a master stage 10 and a slave stage 12, which operate as logic cells along with logic 14 and 15. Master and slave stages 10 and 12 are used for scanning and observing both stages of the dual rail logic. In master stage 10 logic 14 is observed, and in slave stage 12 logic 15 is observed. Logic 14 and 15 corresponds with, for example, dual rail Domino CMOS logic, which is known in the art. Logic 14 to be scanned is isolated through an RCK high signal on line 16 and an ECK low signal on line 18 turning off the corresponding transistors to implement an isolation network. Master stage 10 and slave stage 12 are the same latches as, respectively, the high and low sides of a dual rail Domino logic gate. Use of these existing latch structures for scanning helps to minimize the additional circuitry added to the gate for the scanning.

Master stage 10 also includes control signal nsm at lines 20 and 21 to control latching of a bit into the stage. Master stage 10 includes a switch 25 for latching the bit into the stage at a node 28, and a feedback network 32 for holding a bit at node 28. In operation, with signal SOH high, signal OH is low through an inverter 24 and turns on transistor 33. With transistor 33 on, signal SOH at node 28 is held at a high signal. With signal SOH low, signal OH is high through inverter 24 and turns off transistor 33 and turns on transistor 35. With signal nsm high at line 21, transistor 36 also turns on. With transistors 35 and 36 both on, signal SOH is maintained at a low signal. Node 28 providing signal SOH, as shown, connects with the drains of transistor (PFET) 33 and transistor (NFET) 35.

Feedback network 32 is weakly driven relative to logic 14 and the transistors driven by the RCK and ECK signals on lines 16 and 18. These transistors can easily overdrive the transistors of feedback network 32 during precharge (RCK signal low) and evaluate (ECK signal high) modes. However, during a scan mode (nsm signal low), switch 25 has difficulty passing high values. Therefore, transistor 36 was added to the existing latch structure to disable the pull down of feedback network 32 during the scan mode by turning off transistor 36. The precharge, evaluate, and scan modes are further explained below.

Slave stage 12 includes circuitry similar to master stage 10. Logic 15 to be scanned is isolated through an ECK low signal at line 19 and an RCK high signal at line 17 turning off the corresponding transistors in an isolation network. A switch 27 is used for latching a bit into the stage as controlled by control signal nss at line 22. Slave stage 12 contains SOL signal at node 29 inverted by an inverter 26 to provide the complement, signal OL at node 31. Slave stage 12 also includes a feedback network 37 that operates in a manner similar to network 32 as controlled by signal nss at line 23. Also, feedback network 37 includes an additional transistor 11 operating to disable pull down of network 37 during scan mode (nss signal low) of slave stage 12 in the same manner as described above with respect to feedback network 32.

As shown, master stage 10 and slave stage 12 use an existing latch structure in the gates. In particular, they use inverters 24 and 26, although they could use any type of existing latch structure in a logic gate. Therefore, master stage 10 and slave stage 12 can each be implemented in this example using relatively few transistors in addition to the existing latch structure, namely transistor 36 in feedback network 32 and the transistors in switch 25 in master stage 10, and transistor 11 in feedback network 37 and the transistors in switch 27 of slave stage 12. This helps to reduce the area and delay overhead in scanning.

Figure 2:
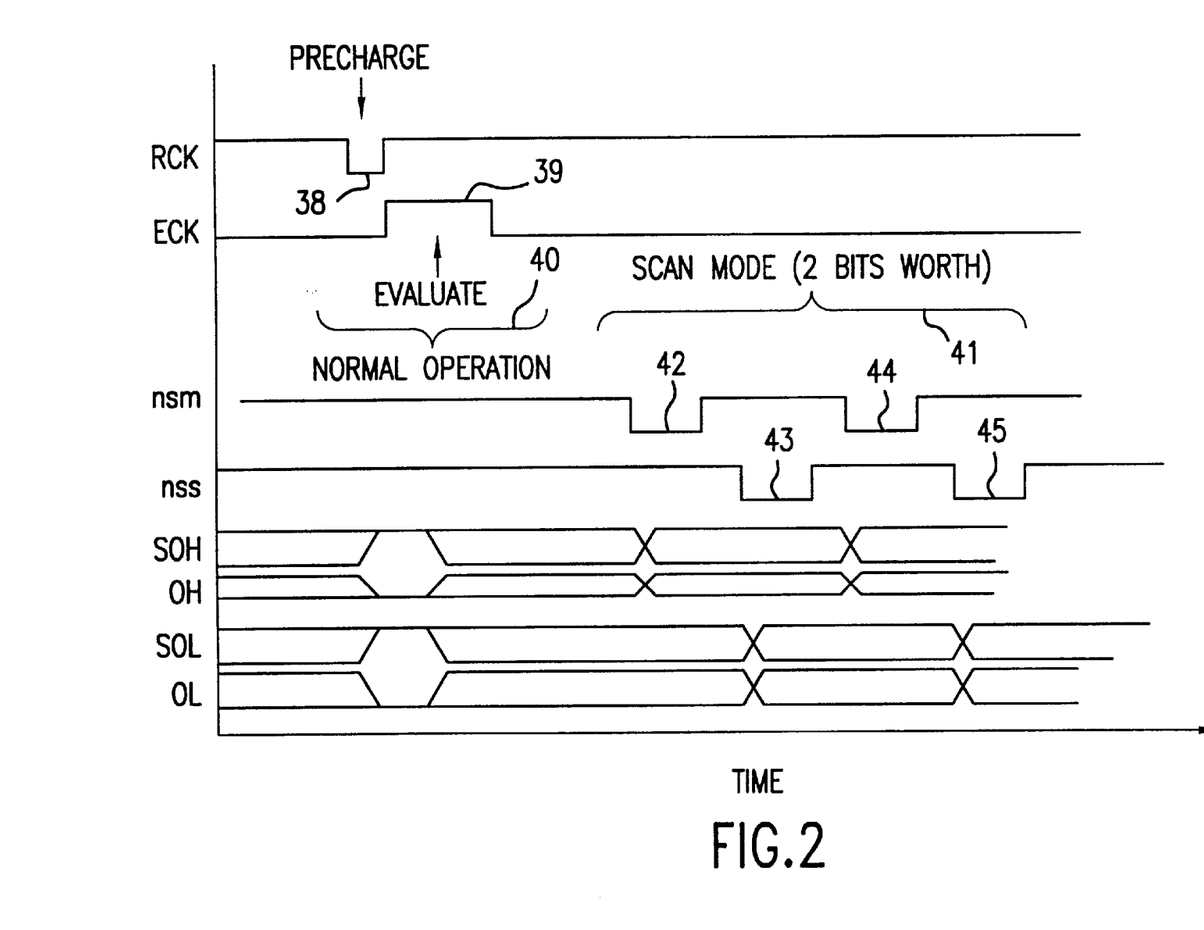
FIG. 2 is a timing diagram illustrating operation of the circuitry in FIG. 1.

FIG. 2 is a timing diagram illustrating operation of the scan circuitry shown in FIG. 1. Under normal operation, as shown by time 40, signal RCK goes low for a precharge 38 and then returns to high along with the a ECK signal for evaluate time 39. FIG. 2 also includes a scan mode 41. This scan mode illustrates scanning of two bits through master stage 10 and slave stage 12. In the scan mode, signal nsm pulses low at time 42, which turns on switch 25 and latches signal $S_{in}$ to node 28. Signal nss subsequently pulses low at time 43 turning on switch 27 to latch the signal at node 30 into slave stage 12 at node 29. Signals nsm and nss again pulse low as shown in times 44 and 45 to latch another bit through master stage 10 and slave stage 12.

The exemplary scan circuitry shown in FIG. 1 thus uses an inverse clock, signals nsm and nss active when low. The inverse clock improves noise immunity among the field-effect (FET) transistors of CMOS logic, which has relatively weak PFETs compared with NFETs. Therefore, a noise coupling event is less likely to turn on switches 25 and 27, as the noisy signal is connected to a PFET and the NFET is isolated behind the nsm/nss inverters in switches 25 and 27. Alternatively, an active high clock may be used.

Figure 3:
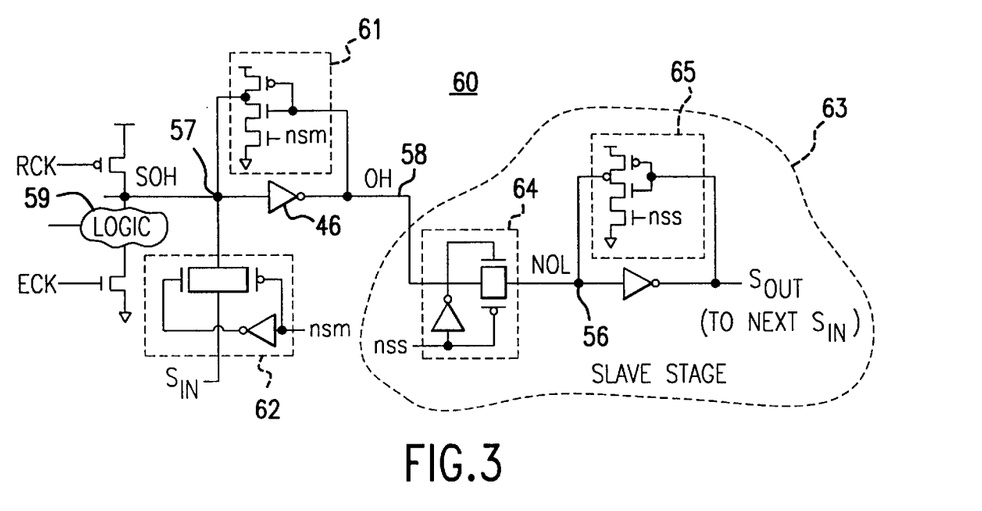
FIG. 3 is a circuit diagram of master and slave scan stages for testing single rail logic.

FIG. 3 is a circuit diagram illustrating scan circuitry for use with single rail logic. Single rail Domino CMOS is known in the art. Circuitry 60 includes similar circuitry as shown in FIG. 1 and operates as a logic cell along with logic 59. In particular, it includes a switch 62 and feedback network 61, both of which operate in a manner similar to switch 25 and network 32. It also includes an isolation network through the transistors controlled by signals RCK and ECK to isolate logic 59. Since single rail logic 59 includes only a single stage, the scan circuitry adds a slave stage 63 as a second logic cell. Slave stage 63 includes a switch 64 for latching signal OH at node 58 into slave stage 63. It also includes a feedback network 65 that operates similar to network 32. Circuit 60 uses an existing latch structure, an inverter 46, to help reduce the area and delay overhead in scanning.

The operation of circuit 60, controlled by control signals RCK, ECK, nsm and nss, operates in a manner similar to the circuit in FIG. 1 as shown in timing diagram in FIG. 2. In particular, when signal nsm pulses low, switch 62 latches signal $S_{in}$ to node 57. When signal nss subsequently pulses low, switch 64 latches signal OH from node 58 to node 56 in slave stage 63.

Figure 4:
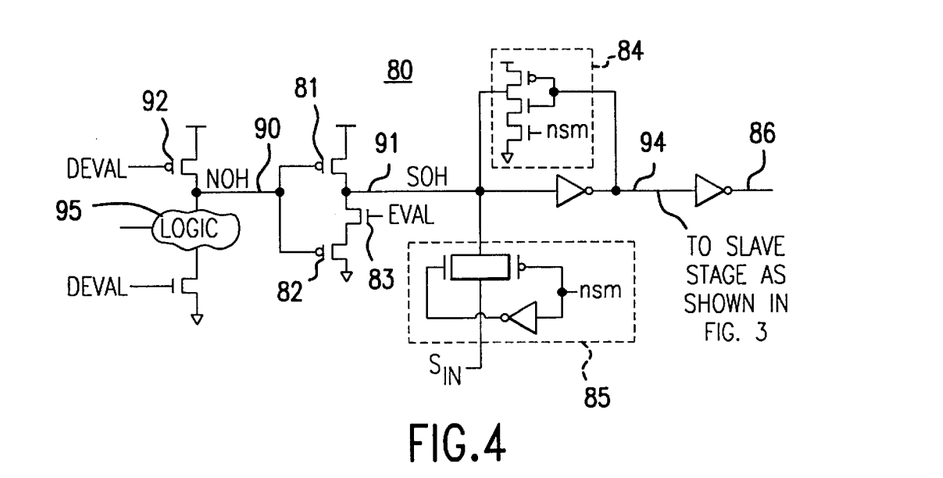
FIG. 4 is a circuit diagram of an alternative latch structure in the scan control circuitry.

FIG. 4 is a circuit diagram illustrating an alternative latch structure. Circuit 80 includes a switch 85 and a feedback network 84, both of which operate in a manner similar to switch 25 and network 32. In addition, circuit 80 includes a pull-up transistor 81 for pulling up signal NOH at node 90. It also includes a pull-down transistor 82 for pulling down signal SOH at node 91 as activated by a high EVAL signal turning on transistor 83. The output of circuit 80 at node 94 is input to a slave stage, which may include circuitry similar to circuit 80 or the slave stage of FIG. 3.

Figure 5:
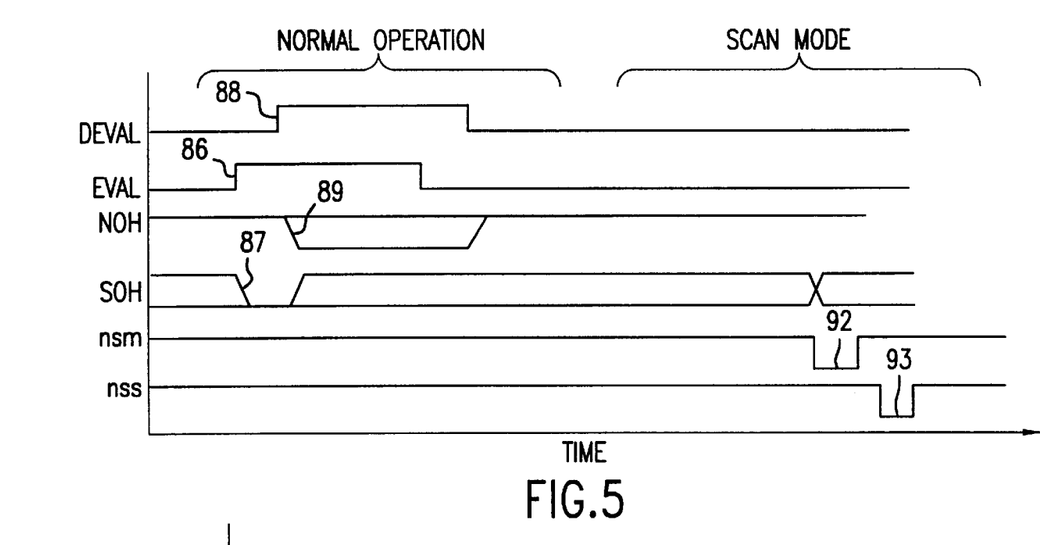
FIG. 5 is a timing diagram illustrating operation of the circuitry in FIG. 4.

FIG. 5 is a timing diagram illustrating operation of circuit 80 in FIG. 4. As shown, when the EVAL signal goes high at time 86, transistor 83 turns on and pulls down signal SOH using transistor 82, as shown at time 87. When the DEVAL signal goes high at time 88, transistor 92 turns off and may pull down signal NOH depending upon the state of logic 95. Signals nsm and nss latch a bit in circuit 80 and the corresponding slave circuit in a manner similar to that shown in the circuitry at FIG. 1. In particular, when signal nsm pulses is low at time 92, switch 85 latches signal $S_{in}$ to node 91. Circuit 80 may include an identical slave stage that receives as an input the signal at node 86 and operates through signal nss pulsing low at time 93.

Figure 6:
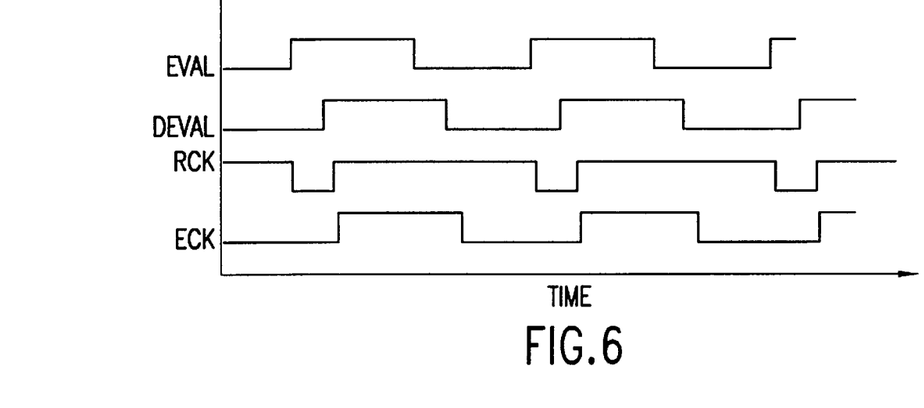
FIG. 6 is a timing diagram illustrating operation of clock signals for the logic gates during normal (non-scan) operation.
Figure 7:
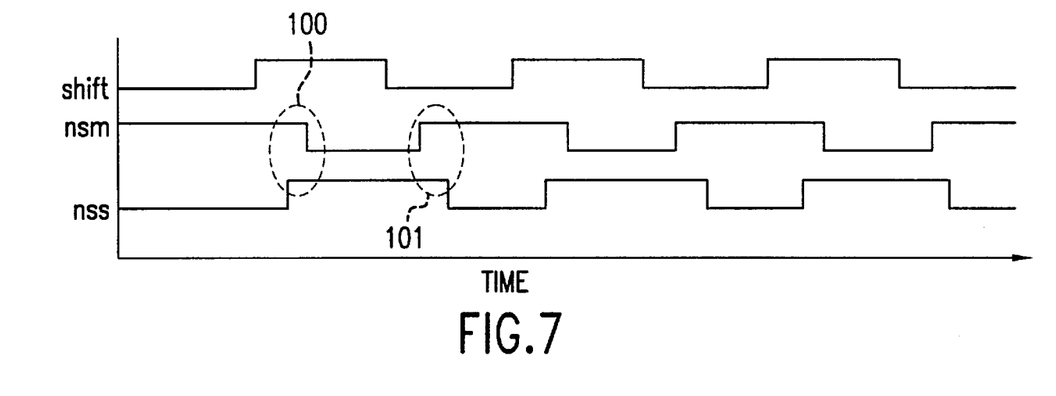
FIG. 7 is a timing diagram illustrating operation of clocking signals for the scan circuitry.

FIG. 6 is a timing diagram illustrating clocking information for signals EVAL, DEVAL, RCK, and ECK for controlling the circuitry. The timing diagram of FIG. 6 illustrates these signals during normal (non-scan) operation. The DEVAL signal is a delayed version of the EVAL signal. The RCK signal is a pulse after a rising EVAL signal. The ECK signal is a pulse starting near the rising RCK signal and falling after the EVAL signal. During scanning, the EVAL, DEVAL, and ECK signals are low and the RCK signal is high, and the nsm and nss signals pulse low in a non-overlapping manner. In other words, the nsm and nss signals should not be low at the same time to prevent race between the master and slave stages. This timing of the nss and nsm signals appears in the timing diagram of FIG. 7. As shown by times 100 and 101, the nsm and nss signals do not pulse low at the same time; they include these non-overlapping portions 100 and 101 to separate the low pulses.

Figure 8:
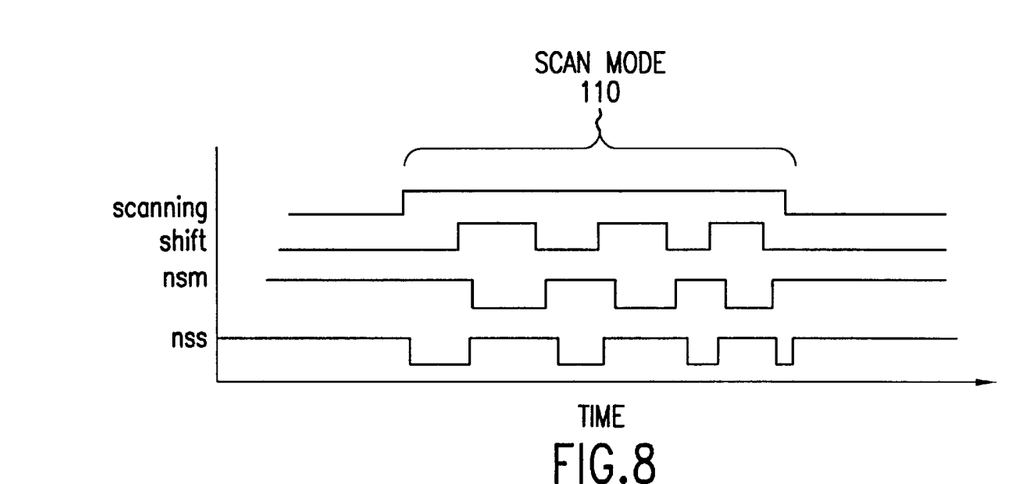
FIG. 8 is a timing diagram of clock signals for a scan mode of scan control circuitry.

FIG. 8 is a timing diagram illustrating control signals during a scan mode. During scanning, the input signals are a scanning signal and a shift signal. The scanning signal is asserted high only during scan mode 110. As shown in FIG. 8 and explained above, the nsm and nss signals pulse low in a non-overlapping manner to latch bits into the master and slave stages.

Figure 9:
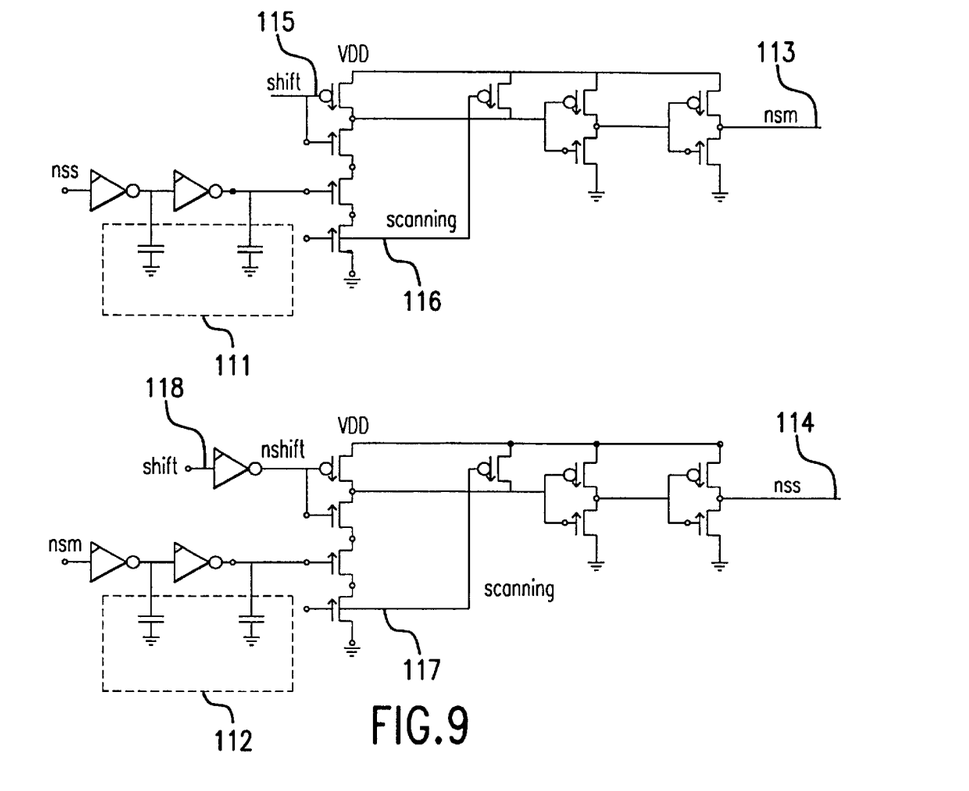
FIG. 9 is a circuit diagram of a clock generator circuit for providing the clock signals shown in FIG. 8.

FIG. 9 is a diagram of an example of a clock generator circuit for producing the signals shown in FIG. 8. It receives the shift signal on line 115 and the scanning signal on lines 116 and 117. It also includes delay elements 111 and 112 for producing the non-overlapping nsm and nss signals on lines 113 and 114. The clock generator circuit in FIG. 9 otherwise operates in a manner known in the art.

Figure 10:
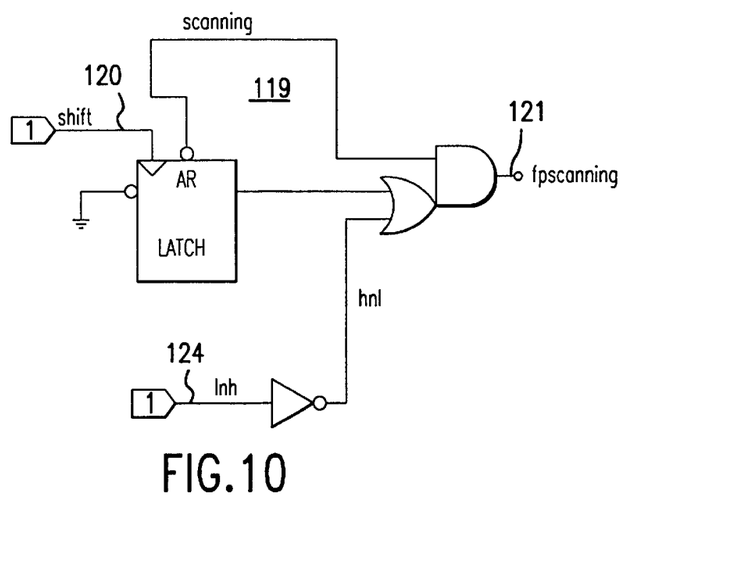
FIG. 10 is a diagram of an alternative clock generating circuit for providing an alternative input to the clock generator circuit shown in FIG. 9 for use in scanning a high side and a low side of dual rail Domino CMOS logic.

FIG. 10 is the diagram of a clock circuit for generating an alternative clock signal for scanning both the high side and low side of, for example, dual rail Domino CMOS logic. Circuit 119 receives the shift signal on line 120 and through the logic shown, produces an fpscanning signal on line 121. The fpscanning signal 121 is input on lines 116 and 117 in the clock generator circuit shown in FIG. 8 for the scanning signal in order to produce control signals for scanning the high side and low side of dual rail logic.

Figure 11:
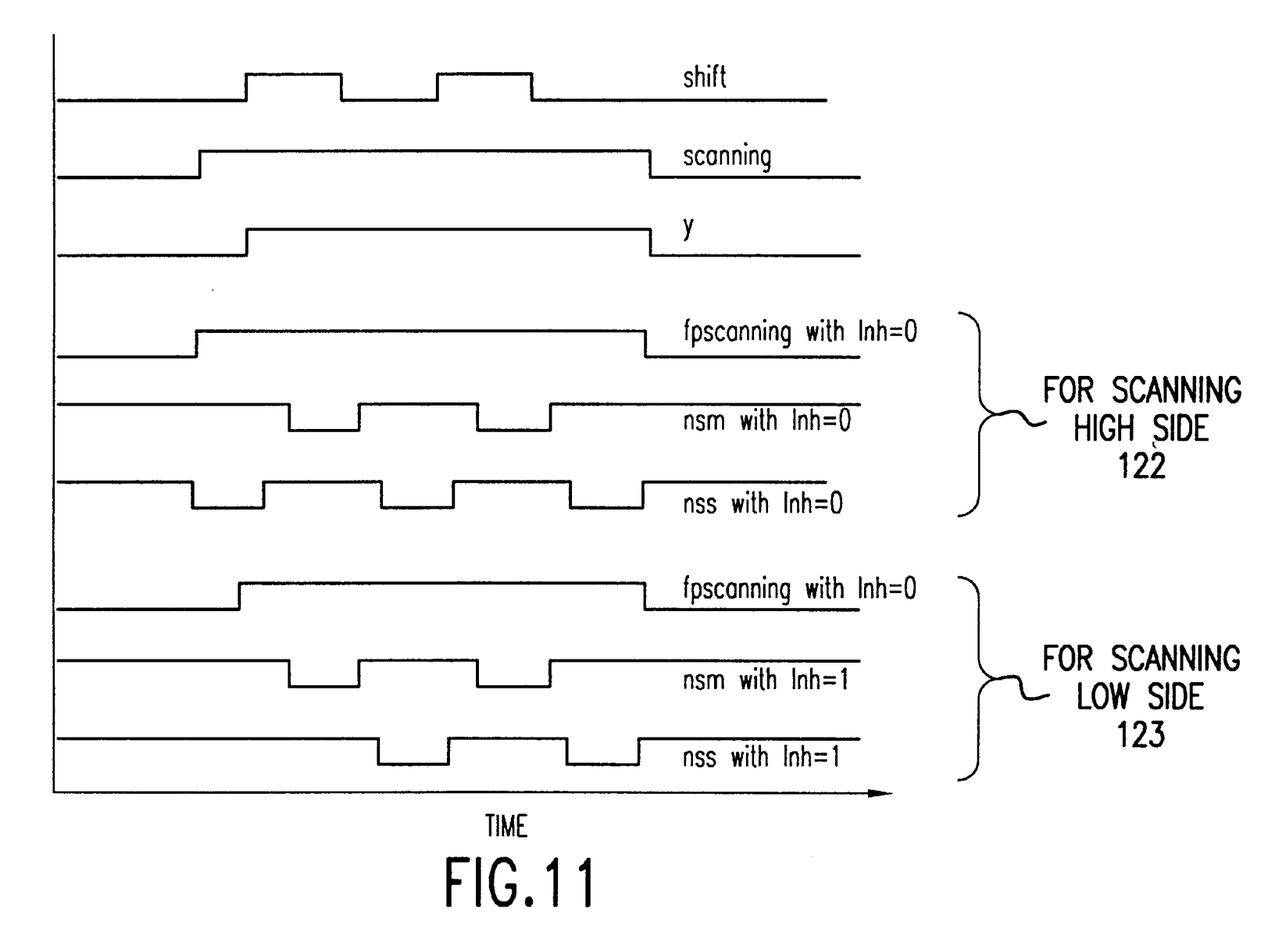
FIG. 11 is a timing diagram illustrating operation of the circuit shown in FIG. 10.

FIG. 11 is timing diagram illustrating operation of circuit 119 for use of scanning the high and low sides of the logic.

Through use of circuit 119 to produce the fpscanning signal 121 as an input to the clock generator shown in FIG. 9, the signals shown in FIG. 11 are produced. They include one set of signals 122 for scanning the high side of the logic, and another set 123 for scanning the low side of the logic. The scanning of the high and low sides is controlled by signal lnh on line 124. Input signal lnh is asserted high to produce control signals for low side observability and is asserted low to produce control signals for high side observability.

Figure 12:
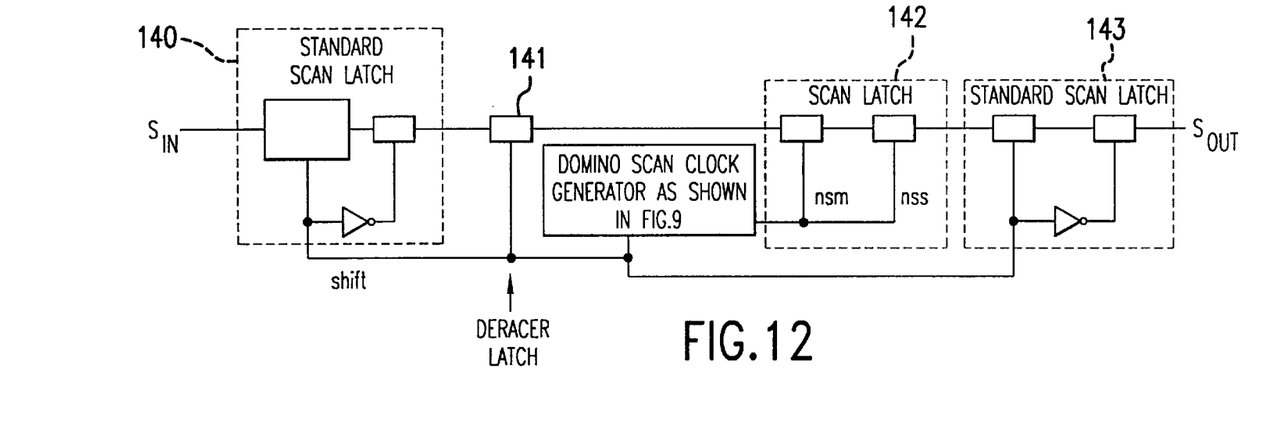
FIG. 12 is a diagram illustrating the interfacing of the scan control circuitry shown in FIG. 1 to standard scan control circuitry.

FIG. 12 is a diagram of a circuit for interfacing the scan circuitry shown in FIG. 1 to standard scan circuitry. It includes a standard scan latch 140 receiving the $S_{in}$ signal. Standard scan circuitry may include, for example, scan circuitry known in the art, and the standard scan circuitry is clocked by the single clock shift signal rather than by the non-overlapping clock signals nsm/nss. A deracer latch 141 receives the output of standard scan latch 140. Latch 141 is clocked by the shift signal of the last standard scan latch before the dual rail Domino logic latch. A scan latch 142, implemented with the circuitry shown in FIG. 1, receives the output of deracer latch 141. Finally, the output of scan latch 142 is input to another standard scan latch 143.

Figure 13:
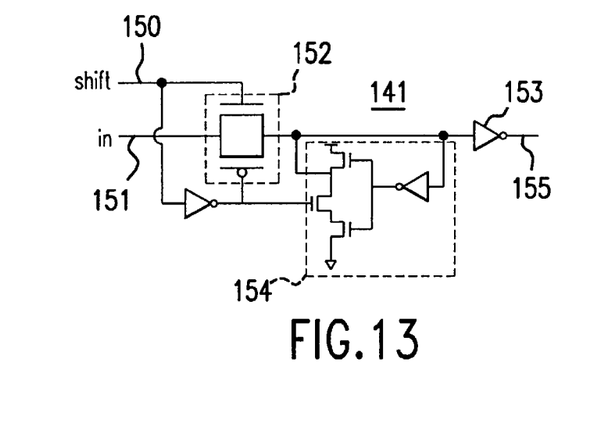
FIG. 13 is a circuit diagram of one example of a latch for implementing a deracer shown in FIG. 12.

FIG. 13 is a diagram of one example of a circuit for implementing deracer latch 141, and other implementations are possible. Deracer latch 141 receives the shift signal on line 150 and the output of standard scan latch 140 on line 151. The "in" signal is latched through a switch 152 and an inverter 153 and is output on line 155. Deracer latch 141 also includes a feedback keeper circuit 154 that operates in a manner known in the art.

Figure 14:
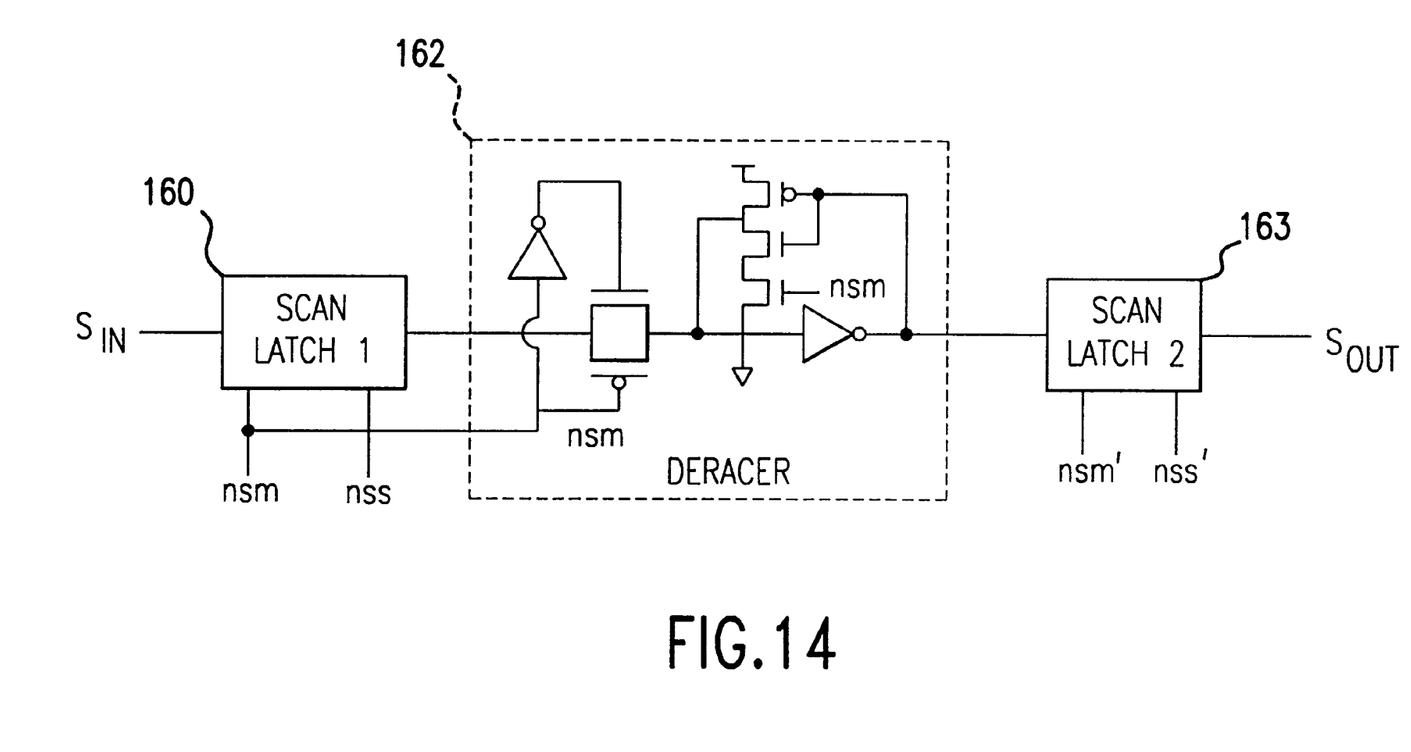
FIG. 14 is a circuit diagram of circuitry for interfacing two Domino logic scan chains that have independent clock generators and require deracing.

FIG. 14 is a diagram of circuitry for interfacing two Domino logic scan chains that have independent clock generators and require deracing. In this example, a deracer 162 interfaces scan latches 160 and 163. Deracer 162 operates to derace scan latch 160 and scan latch 163 when they are controlled by different nsm and nss signals as shown by signals nsm' and nss' controlling scan latch 163. When interfacing the scan circuitry in FIG. 1 to standard scan circuitry as shown in FIG. 12, a deracer 141 is not needed unless the latches are separated by a substantial distance.

While the present invention has been described in connection with an exemplary embodiment, it will be understood that many modifications will be readily apparent to those skilled in the art, and this application is intended to cover any adaptations or variations thereof. For example, different types of transistors, control signals, and labels for the signals may be used without departing from the scope of the invention. This invention should be limited only by the claims and equivalents thereof.

What is claimed is:

1. A circuit for scanning a logic gate for use in observing operation of the logic gate, comprising:
    a master scan stage for scanning a bit into a first logic cell, wherein the master scan stage uses a latch structure in the first logic cell for scanning the bit and receives clock signals for controlling the scanning; and
    a slave scan stage for scanning the bit from the first logic cell into a second logic cell under control of the clock signals,
    wherein the master scan stage includes:
        a switch for scanning the bit into the first logic cell; and
        a transistor coupled into a feedback network in the latch structure to disable pull down of the feedback network during the scanning.

2. The circuit of claim 1 wherein the logic gate has high and low sides and wherein the circuit further includes a clock circuit for generating control signals for scanning the high and low sides of the logic gate.

3. The circuit of claim 2 wherein the clock circuit produces complementary signals as the control signal in response to an input signal.

4. The circuit of claim 1 wherein the switch includes a pair of transistors coupled in parallel and controlled by the clock signals.

5. The circuit of claim 1 wherein the feedback network includes a plurality of transistors coupled in series and controlled by the clock signals.

6. The circuit of claim 1 wherein the second logic cell is complementary to the first logic cell and the slave scan stage uses a latch structure in the second logic cell for scanning the bit.

7. The circuit of claim 1 wherein the slave scan stage operates as the second logic cell.

8. A circuit for scanning a logic gate for use in observing operation of the logic gate, comprising:
    a master scan stage for scanning a bit into a first logic cell, wherein the master scan stage uses a latch structure in the first logic cell for scanning the bit and receives clock signals for controlling the scanning;
    a slave scan stage for scanning the bit from the first logic cell into a second logic cell under control of the clock signals; and
    a deracer circuit, coupled to the output of the slave scan stage, for latching the bit into a next logic cell,
    wherein the deracer circuit includes:
        a switch coupled to receive the bit and having an output terminal;
        an inverter coupled to the output terminal; and
        a feedback keeper circuit coupled to the output terminal.

9. A method for scanning a logic gate for use in observing operation of the logic gate, comprising:
    master scanning a bit into a master scan stage including a first logic cell, wherein the master scanning step includes:
        using a latch structure in the first logic cell for scanning the bit; and
        receiving clock signals for controlling the scanning; and
    slave scanning the bit from the first logic cell into a slave scan stage including a second logic cell under control of the clock signals,
    wherein the master scanning step includes:
        transmitting the bit through a switch into the first logic cell; and
        disabling pull down of a feedback network in the latch structure during the scanning.

10. The method of claim 9 wherein the logic gate has high and low sides and wherein the method further includes generating control signals for scanning the high and low sides of the logic gate.

11. The method of claim 10 wherein the generating step includes producing complementary signals as the control signal in response to an input signal.

12. The method of claim 9 wherein the transmitting step includes turning on a pair of transistors coupled in parallel.

13. The method of claim 9 wherein the controlling step includes using a plurality of transistors coupled in series.

14. The method of claim 9 wherein the slave scanning step includes:
   scanning the bit into the second logic cell that is complementary to the first logic cell; and
   using a latch structure in the second logic cell for scanning the bit.

15. The method of claim 9 wherein the slave scanning step includes using the slave scan stage as the second logic cell.

16. A method for scanning a logic gate for use in observing operation of the logic gate, comprising:
   master scanning a bit into a master scan stage including a first logic cell, wherein the master scanning step includes:
      using a latch structure in the first logic cell for scanning the bit; and
      receiving clock signals for controlling the scanning;
   slave scanning the bit from the first logic cell into a slave scan stage including a second logic cell under control of the clock signals; and
   using a deracer circuit for latching the bit into a next logic cell,
   wherein using the deracer circuit step includes:
      transmitting the bit through a switch to an inverter; and
      using a feedback keeper circuit to control a state of the bit.

* * * * *